(12) United States Patent
Nakayama et al.

(10) Patent No.: US 10,012,705 B2
(45) Date of Patent: Jul. 3, 2018

(54) MAGNETISM MEASUREMENT DEVICE

(71) Applicants: NATIONAL UNIVERSITY CORPORATION NAGOYA UNIVERSITY, Nagoya-shi, Aichi (JP); FUJIDENOLO CO., LTD., Komaki-shi, Aichi (JP)

(72) Inventors: Shinsuke Nakayama, Nagoya (JP); Hideki Miyazaki, Komaki (JP)

(73) Assignees: NATIONAL UNIVERSITY CORPORATION NAGOYA UNIVERSITY, Nagoya-shi (JP); FUJIDENOLO CO., LTD., Komaki-shi (JP)

( * ) Notice: Subject to any disclaimer, the term of this patent is extended or adjusted under 35 U.S.C. 154(b) by 155 days.

(21) Appl. No.: 14/773,633

(22) PCT Filed: Mar. 7, 2014

(86) PCT No.: PCT/JP2014/056077
§ 371 (c)(1),
(2) Date: Sep. 8, 2015

(87) PCT Pub. No.: WO2014/136975
PCT Pub. Date: Sep. 12, 2014

(65) Prior Publication Data
US 2016/0041236 A1    Feb. 11, 2016

(30) Foreign Application Priority Data

Mar. 8, 2013 (JP) .................................. 2013-046439

(51) Int. Cl.
*G01N 27/72* (2006.01)
*G01R 33/12* (2006.01)
(Continued)

(52) U.S. Cl.
CPC ......... *G01R 33/02* (2013.01); *G01R 33/0029* (2013.01); *G01R 33/028* (2013.01)

(58) Field of Classification Search
CPC ... G01R 33/02; G01R 33/0029; G01R 33/028
(Continued)

(56) References Cited

U.S. PATENT DOCUMENTS

| 4,803,773 A | 2/1989 | Schonstedt |
| 4,839,624 A | 6/1989 | Schonstedt |

(Continued)

FOREIGN PATENT DOCUMENTS

| JP | S48-3377   | 1/1973 |
| JP | S48-14275 U | 2/1973 |

(Continued)

OTHER PUBLICATIONS

Jun. 10, 2014 International Search Report issued in International Patent Application No. PCT/JP2014/056077.
(Continued)

*Primary Examiner* — Giovanni Astacio-Oquendo
(74) *Attorney, Agent, or Firm* — Oliff PLC

(57) ABSTRACT

Magnetic-field measuring device having: elongate magnetic-material formed of solid or liquid having magnetic-anisotropy, or composite of solid and liquid; an electrically conductive-body adjacent to magnetic-material, giving magnetic-material a current-induced magnetic-field-vector having a component perpendicular to longitudinal-directions of magnetic-material; coil detecting magnetic-field by magnetic-material, which is magnetized in a direction perpendicular to its longitudinal-direction when no external magnetic-field is applied to magnetic-material or when only a magnetic-field not having a component in longitudinal-direction applied to magnetic-material, and magnetizing in direction having the component in longitudinal-direction (Continued)

when external magnetic-field have the component in longitudinal-direction of magnetic-material applied to magnetic-material, a direction of magnetization of magnetic-material aligned with direction perpendicular to longitudinal-direction of magnetic-material when magnetic-material sufficiently receives current-induced magnetic-field-vector, magnetic-field measuring device intermittently applies current to the conductive-body, detecting an electromotive-force generated by the coil while current is applied to the conductive-body and no current is applied to the conductive-body.

6 Claims, 7 Drawing Sheets

(51) Int. Cl.
    *G01R 33/02*     (2006.01)
    *G01R 33/00*     (2006.01)
    *G01R 33/028*     (2006.01)

(58) Field of Classification Search
    USPC .......................................... 324/239, 200, 228
    See application file for complete search history.

(56) References Cited

U.S. PATENT DOCUMENTS

| | | | | |
|---|---|---|---|---|
| 5,348,237 | A * | 9/1994 | Halbedel | B01F 13/0809 241/172 |
| 5,363,078 | A * | 11/1994 | Ries | H01F 7/0278 324/319 |
| 5,491,459 | A * | 2/1996 | Leupold | H01F 7/0278 315/5.35 |
| 5,751,112 | A | 5/1998 | Monma et al. | |
| 2006/0038561 | A1 | 2/2006 | Honkura et al. | |
| 2008/0143533 | A1 | 6/2008 | Marin Palacios et al. | |
| 2011/0080164 | A1 | 4/2011 | Honkura et al. | |
| 2011/0163744 | A1 * | 7/2011 | Nakayama | G01N 33/4833 324/249 |
| 2012/0038358 | A1 | 2/2012 | Honkura et al. | |
| 2012/0326702 | A1 * | 12/2012 | Miyazaki | G02F 1/21 324/76.12 |
| 2013/0027031 | A1 * | 1/2013 | Dimitrov | G01R 33/093 324/252 |
| 2013/0342197 | A1 * | 12/2013 | Uchiyama | G01R 33/0023 324/258 |
| 2015/0085569 | A1 * | 3/2015 | Nozaki | H01L 29/66984 365/158 |
| 2016/0055866 | A1 * | 2/2016 | Le | G11B 5/39 360/75 |

FOREIGN PATENT DOCUMENTS

| | | |
|---|---|---|
| JP | S63-38189 A | 2/1988 |
| JP | 2002-277522 A | 9/2002 |
| JP | 2003-004830 A | 1/2003 |
| JP | 2010-256109 A | 11/2010 |
| JP | 2011-053160 A | 3/2011 |
| JP | 2012-185103 A | 9/2012 |
| JP | 2012-198038 A | 10/2012 |
| WO | 2005/019851 A1 | 3/2005 |
| WO | 2009/130814 A1 | 10/2009 |

OTHER PUBLICATIONS

Jul. 6, 2015 International Preliminary Report on Patentability issued in International Patent Application No. PCT/JP2014/056077.
Uchiyama et al; "Biomagnetic field detection using very high sensitivity magnetoimpedance sensors for medical applications;" Physica Status Solidi A; Feb. 5, 2009; vol. 206; No. 4; pp. 639-643.
Nakayama et al; "Pulse-driven magnetoimpedance sensor detection of cardiac magnetic activity;" PLoS ONE; Oct. 12, 2011; vol. 6; No. 10; pp. 1-6.
Melo et al; "Optimization of the magnetic noise and sensitivity of giant magnetoimpedance sensors;" Journal of Applied Physics; Feb. 6, 2008; vol. 103; pp. 1-6.
Nakayama et al; "Pulse-driven magnetoimpedance sensor detection of biomagnetic fields in musculatures with spontaneous electric activity;" Biosensors and Bioelectronics; Jun. 1, 2011; vol. 27; pp. 34-39.
Jul. 4, 2017 Office Action issued in Japanese Patent Application No. 2013-046439.
Jan. 31, 2017 Office Action issued in Japanese Patent Application No. 2013-046439.
Jan. 25, 2017 Search Report issued in European Patent Application No. 14760217.1.

* cited by examiner

FIG.3
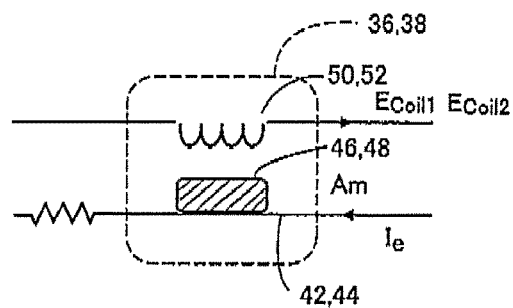
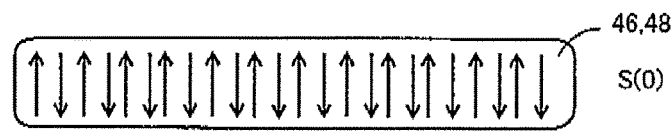
FIG.4A
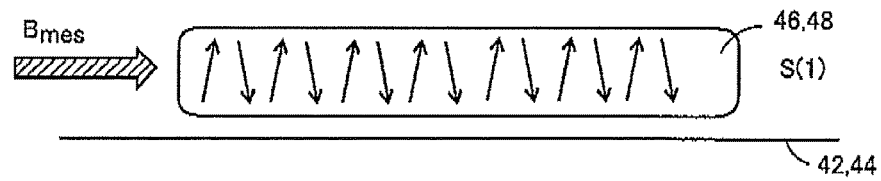
FIG.4B
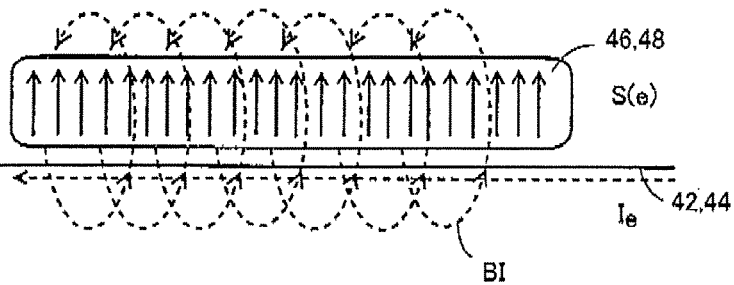
FIG.4C

MAGNETISM MEASUREMENT DEVICE

TECHNICAL FIELD

The present invention relates to a magnetic-field measuring device, and more particularly to a magnetic-field measuring device for detecting magnetism on the basis of a variation of a magnetic moment in a material having magnetic anisotropy.

BACKGROUND ART

Researches have been widely made regarding a magnetic-field measuring device for measuring magnetism with high sensitivity on the order of picotesla or nanotesla. For example, there have been proposed magnetic-field measuring devices using a superconducting quantum interference element or device (SQUID) or a magneto-impedance sensor (MI sensor).

Of these magnetic-field measuring devices, the magnetic-field detecting device using the SQUID utilizes a superconducting Josephson effect and a superconducting coil, and has a problem of requirement for a large-scale device for maintaining the magnetic-field detecting device at an extremely low temperature to establish a superconducting state, and equipment for tightly shielding the magnetic-field detecting device from an ambient magnetic field.

On the other hand, the magnetic-field sensing device using the MI sensor is a sensor utilizing a phenomenon that an impedance of the MI element varies, due to a skin effect, depending upon the frequency of an alternating current applied to the sensor, and accordingly has an advantage that the sensor does not require a large-scale device and equipment as required by the above-described magnetic-field detecting device using the SQUID.

However, the MI sensor described above requires electrical connection of conductors to amorphous wires having magnetic anisotropy, for applying the alternating current to the amorphous wires. This electrical connection is made by a method such as soldering and ultrasonic welding, which involves heat application to and vibratory motions of the amorphous wires, causing thermal expansion and contraction and positional displacement of the amorphous wires, and consequent variation of tension of the amorphous wires, giving rise to deterioration of accuracy of detection of the magnetic field by the MI sensor. While the MI sensor is required to have a high degree of uniformity in its quality as a product, it is difficult to control the variation of tension of the amorphous wires due to physical changes of the amorphous wires, namely, their thermal expansion and contraction, and positional displacement. Thus, there was a high risk of difficulty to produce the MI sensor having the required uniformity of quality. FIG. 12 is a view indicating a relationship between the tension of the amorphous wires and the sensitivity of the MI sensor, which was obtained by an experiment conducted by the present inventors. In FIG. 12, the tension of the amorphous wires is taken along the horizontal axis, while the sensitivity of the amorphous wires is taken along the vertical axis. As indicated in FIG. 12, the sensitivity of the amorphous wires, that is, their resolution of detection decreases with an increase of their tension, that is, the sensitivity and the tension of the amorphous wires have a close relationship therebetween. In this respect, the variation of the tension of the amorphous wires attached to the MI sensor is not negligible for assuring the desired performance of the MI sensor as the product.

Where the MI sensor is a gradiometer (gradient magnetic-field detecting device) configured to detect the magnetic field on the basis of a difference between outputs of two sensors, in particular, these two sensors should be produced so as to have the same degree of sensitivity. However, there is a possibility of difficulty to produce the two sensors having the same degree of sensitivity, where the amorphous wires are connected by the soldering or similar method described above.

PRIOR ART DOCUMENTS

Patent Documents

Patent Document 1: JP-2003-004830 A
Patent Document 2: WO 2005/019851 A1
Patent Document 3: JP-2010-256109 A
Patent Document 4: WO 2009/130814 A1
Patent Document 5: JP-2012-185103 A Non-Patent Documents Non-Patent Document 1:
Uchiyama, T., Nakayama, S., Mohri, K., Bushida, K., "Biomagnetic field detection using very high sensitive MI sensor for medical application" Physica Status SolidiA-Applications and Materials Science, 2009, 206, 639-643.
Non-Patent Document 2:
Nakayama, S., Atsuta, S., Shinmi, T., Uchiyama, T., "Pulse-driven magnetoimpedance sensor detection of biomagnetic fields in musculatures with spontaneous electric activity" Biosensors and Bioelectronics, 2011, 27, 34-39.
Non-Patent Document 3:
Nakayama, S., Sawamura, K., Mohri, K, Uchiyama, T., "Pulse-driven magnetoimpedance sensor detection of cardiac magnetic activity", PLoS ONE, 2011, 6(10), e25834.
Non-Patent Document 4:
Melo L G C, Menard D, Yelon A, Ding L, Saez S, Dolabdjian C, "Optimization of the magnetic noise and sensitivity of giant magnetoimpedance sensors" J Appl Phys, 2008, 103: 033903.

SUMMARY OF THE INVENTION

Object Achieved by the Invention

The present invention was made in view of the background art described above. It is therefore an object of the present invention to provide a magnetic-field measuring device which can be produced with a simpler arrangement using a magnetic material having magnetic anisotropy and which permits high accuracy of measurement of the magnetic field.

Means for Achieving the Object

The present inventors found that the magnetic material having magnetic anisotropy have different directions of internal magnetization when any external magnetic field is not applied to the magnetic material and when an external magnetic field in which a subject to be measured is present is applied to the magnetic material, and that the direction of magnetization of the magnetic material is aligned with a magnetic field which is induced by application of an electric current not smaller than a predetermined value to a conductor disposed adjacent to the magnetic material. The present invention was made based on these findings.

The object indicated above is achieved according to the principle of the present invention, which provides a magnetic-field measuring device having: (a) a magnetic material formed of a solid or liquid having magnetic anisotropy, or a composite of the solid and liquid; (b) an electrically conductive body disposed adjacent to the above-described magnetic material, so as to give a current-induced magnetic-field vector having a component perpendicular to a direction of easy magnetization of the above-described magnetic material; and (c) a coil to detect a magnetic field. The magnetic-field measuring device is characterized by (d) repeatedly applying an electric current to said electrically conductive body, and (e) detecting an electromotive force generated by the above-described coil, and obtaining an output of the above-described coil as an output signal of the magnetic-field measuring device.

Advantages of the Invention

According to the present invention defined in the principle of the present invention, the above-described magnetic material generates the magnetic field on the basis of the electric current applied to the electrically conductive body, and the generated magnetic field causes the above-described coil to generate the electromotive force. The magnetic field can be detected by measuring the electromotive force, so that it is not necessary to positively apply the electric current to the magnetic material. Since it is not necessary to apply the electric current to the magnetic material, the electrical connection of the magnetic material is not necessary, so that the magnetic-field measuring device does not suffer from influences of physical changes of the magnetic material due to generation of heat and vibratory motions.

In one preferred form of the invention, the above-described magnetic material is an amorphous material. According to this form of the invention, the direction of magnetization of the amorphous material easily changes due to the magnetic field to be measured, and the magnetic field generated by application of the electric current to the electrically conductive body, whereby the electromotive force is easily generated by the coil in the magnetic fields. Accordingly, the magnetic field can be easily measured with a high degree of accuracy.

In another preferred form of the invention, the above-described electric current is a pulse current, a current a value of which intermittently changes in a predetermined pattern, or a current which is a composite of those two currents superimposed on each other. According to this form of the invention, the amount of the electric current applied to the electrically conductive body intermittently changes, so that the magnetic field can be measured on the basis of a change of the electromotive force of the above-described coil in synchronization of the change of the amount of the applied electric current.

In a further preferred form of the invention, (a) the above-described magnetic material consists of at least one amorphous wire having the direction of easy magnetization parallel to its longitudinal direction, and (b) the above-described electrically conductive body consists of at least one conductor wire. According to this form of the invention, the above-described magnetic material and the above-described electrically conductive body are suitably arranged in the present magnetic-field measuring device.

In a still further preferred form of the invention, (a) the above-described magnetic material has a symmetrical shape with respect to a straight line or plane of symmetry which passes a midpoint in its direction of easy magnetization, and which is perpendicular to the direction of easy magnetization, and (b) the above-described coil consists of two coils which are disposed at respective positions which are symmetrical with each other with respect to the above-described line or plane of symmetry, (c) whereby the magnetic-field measuring device is provided with a gradiometer. According to this form of the invention, the two coils are disposed symmetrically with each other with respect to the line or plane of symmetry of the magnetic material, so that an influence of the ambient magnetic field such as the terrestrial magnetic field can be effectively eliminated, whereby the accuracy of measurement of the magnetic-field measuring device provided with the gradiometer can be improved.

In a yet further preferred form of the invention, (a) the above-described magnetic material includes an amorphous material having magnetic anisotropy, and (b) the above-described amorphous material consists of at least one layer surrounding the above-described electrically conductive body. According to this form of the invention, the magnetic-field measuring device can be configured such that the amorphous material and the electrically conductive body are disposed adjacent to each other.

In still another preferred form of the invention, (a) the above-described magnetic material includes an elongate amorphous material having magnetic anisotropy, and (b) the above-described elongate amorphous material consists of at least one cylindrical layer wound in a coil on the above-described electrically conductive body so as to surround the electrically conductive body. According to this form of the invention, the magnetic-field measuring device can be configured such that the amorphous material and the electrically conductive body are disposed adjacent to each other.

In yet another preferred form of the invention, the above-described amorphous material and the above-described electrically conductive body are electrically insulated from each other. According to this form of the invention, the magnetic field generated by the amorphous material is not influenced by the electric current flowing through the amorphous material. Where the amount of electric current flowing through the electrically conductive body is not so large as to influence the measurement of the magnetic field, however, the amorphous material and the electrically conductive body need not be electrically insulated from each other.

BRIEF DESCRIPTION OF THE DRAWINGS

FIG. 3 is a view for explaining an electrical arrangement of sensors;

FIGS. 4A to 4C are views for explaining distributions of magnetic charges within amorphous materials;

MODE FOR CARRYING OUT THE INVENTION

Embodiments of this invention will be described in detail by reference to the drawings.

First Embodiment

Figure 1:
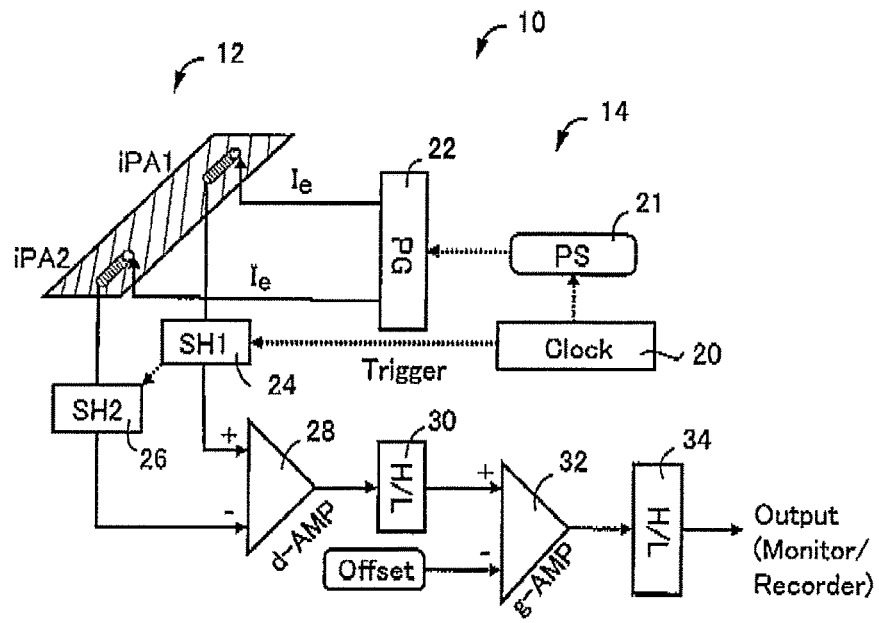
FIG. 1 is a schematic view for explaining a magnetic-field measuring device according to an embodiment of this invention.

FIG. 1 is the schematic view for explaining a magnetic-field measuring device 10 according to an embodiment of this invention. The magnetic-field measuring device 10 includes a probe portion 12 to detect magnetism, and a circuit portion 14 to drive the probe portion 12. In the present embodiment, the probe portion 12 provides a magnetic gradiometer, which includes to two magneto-sensors, as described below. The probe portion 12 will be described later.

The circuit portion 14 has a clock portion 20, a power supply portion 21 and a pulse generator 22, which are configured to apply an electric current to conductive portions 42 and 44 of the probe portion 12 described below. The clock portion 20 is a CMOS IC, for instance, and is configured to generate a pulse signal at a predetermined time interval. The pulse generator 22 is configured to apply a intermittently varying electric current Ie to the conductive portions 42 and 44 of the probe portion 12, on the basis of the pulse signal generated by the above-indicated clock portion 20 and a line voltage of the power supply portion 21. The intermittently varying electric current Ie takes the form of a rectangular pulse wave, for instance.

The circuit portion 14 has sample hold circuits 24 and 26 to detect induced electromotive forces Ecoil1 and Ecoil2 generated by coils 50, 52 of the probe portion 12 described below, a differential amplifier 28, a filter 30, an amplifier 32 and a filter 34. The sample hold circuits 24 and 26 detect peaks (peak values) of amplitude of the electromotive forces Ecoil1 and Ecoil2 of the coils 50 and 52. In this respect, it is noted that the above-indicated clock portion 20 applies a trigger signal to the sample hold circuits 24 and 26, so that the detection of the peak values by the sample hold circuits 24 and 26 takes place at predetermined points of time (phase) in synchronization with this trigger signal. The differential amplifier 28 generates an output representing a difference between the output values of the sample hold circuits 24 and 26. Thus, the probe portion 12 including the two magneto-sensors functions as a gradiometer. The filter 30 is configured to remove a high-frequency component and a low-frequency component from the output of the differential amplifier 28 (to operate as a high-pass filter and a low-pass filter), and to generate an output representative of only a predetermined frequency component. The amplifier 32 is configured to amplify the output signal of the filter 30 by 1000 times, for example, according to a predetermined offset voltage Offset. The filter 34 is configured to remove a high-frequency component and a low-frequency component from the output of the amplifier 32, and to generate an output representative of only a predetermined frequency component. The output signal of the filter 34 is sent to a monitor or any other display device, a recording device, or any other device.

Figure 2:
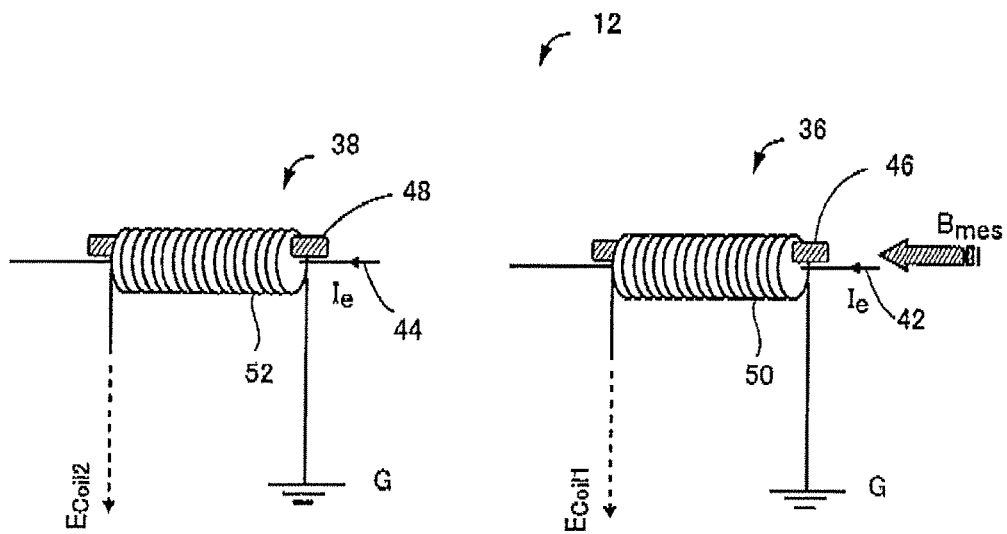
FIG. 2 is a view schematically showing a basic arrangement of a probe portion.

FIG. 2 is the view schematically showing a basic arrangement of the probe portion 12. The probe portion 12 provided according to the present embodiment includes sensors 36 and 38. As described above, the present magnetic-field measuring device 10 is provided with a gradiometer, wherein one of the sensors 36 and 38 serves as a sensor for measuring a magnetic field Bmes of the subject to be measured, while the other sensor serves as a reference sensor. For this reason, the two sensors 36 and 38 have the same arrangement. Each of the sensors 36 and 38 has a magnetic material in the form of an amorphous material 46, 48, an electrically conductive body in the form of a conductor wire 42, 44, and the coil 50, 52. The amorphous materials 46 and 48 are elongate amorphous wires. The conductor wires 42 and 44 are disposed adjacent to the respective amorphous materials 46 and 48 such that the conductor wires 42 and 44 extend parallel to the longitudinal direction of the amorphous materials 46 and 48. The coils 50 and 52 are solenoid, coils defining inner spaces through which the amorphous materials 46 and 48 and the conductor wires 42 and 44 extend. In this respect, it is noted that the amorphous materials 46 and 48 and the conductor wires 42 and 44 are not held in electrical contact with each other, with an air gap or an electrically insulating material being interposed therebetween. As described below, the arrangement of the sensors is not limited to the one described above. For example, the amorphous materials 46 and 48 need not take the form of rods shown in FIG. 2, as long as the amorphous materials 46 and 48 are elongate members. The positional relationship of the coils 50 and 52 with respect to the amorphous materials 46 and 48 and the conductor wires 42 and 44 is not limited to the above described arrangement wherein the amorphous materials 46 and 48 and the conductor wires 42 and 44 extend through the inner spaces of the coils 50 and 52. Namely, the coils 50 and 52 may be otherwise positioned relative to the amorphous materials 46 and 48 and the conductor wires 42 and 44, as long as the coils 50 and 52 can generate electric currents induced by the amorphous materials 46 and 48. It is noted that the sensors 36 and 38 are spaced apart from each other so that one of these two sensors detects the magnetic field Bmes of the subject, while the other sensor does not detect the magnetic field Bmes.

FIG. 3 is the view for explaining an electrical arrangement of the sensors 36, 38. The pulse generator 22 shown in FIG. 1 applies a pulse current Ie to the conductor wires 42 and 44, and the electromotive forces Ecoil1 and Ecoil2 generated by the respective coils 50 and 52 are applied to the respective sample hold circuits 24 and 26. It is noted that each of the sensors 36 and 38 used according to the present embodiment is referred to as an iPA sensor (induced para-magnetization alignment sensor) or an iPA sensor element.

Referring to FIGS. 4A to 4C, an operating principle of the iPA sensors in the form of the sensors 36 and 38 will be briefly described. FIGS. 4A to 4C are views showing only the amorphous material 46, 48 and the conductor wire 42, 44 of each iPA sensor, and explaining distributions of a magnetic charge within the amorphous material 46, 48. Arrows in the figures schematically indicate directions of the magnetic charge within the amorphous material 46, 48. FIG. 4A indicates a non-magnetic-field state in which an external magnetic field is not applied to the iPA sensor, namely, a so-called control state S(0) in which only an ambient magnetic field is applied to the iPA sensor. FIG. 4B indicates a state S(1) in which the magnetic field Bmes of the subject to be measured is applied to the iPA sensor, while FIG. 4C indicates a state S(e) in which a sufficient exciting electric current Ie is applied to the conductor wire 42, 44.

The state of magnetization of the amorphous material 46, 48 changes due to minute external magnetic field or fields, for instance, from the state S(0) of FIG. 4A to the state S(1) of FIG. 4B. Namely, in the control state S(0), the direction of magnetization (Mam) of the amorphous material 46, 48 is perpendicular to its longitudinal direction. In the state S(1) in which the magnetic field Bmes is applied to the amorphous material 46, 48, on the other hand, the orientation of a magnetic moment defining a direction of easy magnetization partially changes. When the sufficient exciting electric current Ie is applied to the conductor wire 42, 44 disposed adjacent to the amorphous material 46, 48, as indicated in FIG. 4C, magnetic field BI is generated as indicated by broken lines in the same figure. In the state S(e) of FIG. 4C, a given amount of magnetization within the amorphous material 46, 48 is aligned with the direction of the magnetic field BI. Thus, the application of the exciting electric current Ie permits alignment of the magnetization, and causes generation of a transient magnetic field. The intensity of the above-indicated transient magnetic field generated as a result of alignment of the magnetization changes depending on the magnetic field before the application of the exciting electric current Ie, more specifically, depending on the state of magnetization of the amorphous material 46, 48 in that magnetic field. Described in detail, the intensity of the transient magnetic field generated when the amorphous wire 46, 48 is switched from the state S(0) to the state S(e), and that generated when the amorphous wire 46, 48 is switched from the state S(1) to the state S(e) are different from each other.

The transient magnetic field thus generated by the amorphous wire 46, 48 is detected by the corresponding coil 50, 52, as a change of the electromotive force Ecoil1, Ecoil2. This change of the electromotive force represents a change of the magnetization of the amorphous material 46, 48 before and after the application of the exciting electric current Ie. Described more specifically, the amount of the change depends on the magnetic field applied to the amorphous wire 46, 48 before the application of the exciting electric current Ie. In the state S(0) of the amorphous wire 46, 48 before the application of the exciting electric current Ie, the amount of the change is represented by {Mam(S(e))− Mam(S(0))}/Δt. In the state S(1) of the amorphous wire 46, 48 before the application of the exciting electric current Ie, the amount of the change is represented by {Mam(S(e))− Mam(S(1))}/Δt. Thus, the change of the electromotive force Ecoil1, Ecoil2 of the coil 50, 52 reflects the magnetic field Bmes applied to the subject to be measured. The intensity of the magnetic field Bmes can be calculated on the basis of the change of the electromotive force Ecoil1, Ecoil 2. It is noted that the above-indicated value Δt represents a length of time required for alignment of the direction of magnetization, which is on the order of nanoseconds, for example.

In the present embodiment in which the exciting electric current Ie is the pulse current, a time period of an excited state in which the magnetization of the amorphous material 46, 48 is aligned by the application of the exciting electric current Ie, and a time period of a non-excited state in which the magnetization is in the original state without the application of the exciting electric current Ie are repeatedly established at a high frequency. Accordingly, it is possible to detect a difference between the electromotive forces induced by the coil 50, 52 in the time periods of the excited and non-excited states. Further, an average of a plurality of values of the difference obtained by repeating this detection may be calculated.

The amount of the above-described exciting electric current Ie is determined to be large enough to permit alignment of the internal magnetization of the amorphous wire 46, 48 in the ambient magnetic field, namely, in the terrestrial magnetism in the normal room environment. Described more specifically, where the conductor wire 42, 44 linearly extends, as shown in FIGS. 2-4A to 4C, an approximate value of the intensity of the induced magnetic field BI at a position adjacent to the conductor wire 42, 44 upon application of the exciting electric current Ie is represented by the following equation, according to the Ampere's law:

$$Be = \mu_0 I / 2\pi r$$

In the equation, "$\mu_0$" represents magnetic permeability in vacuum ($=4\pi \times 10^{-7}$(T/A/m)), and "r" represents a distance from the centerline of the conductor wire 42, 44. Where the amount I of the exciting electric current Ie is 200 mA, the induced magnetic field BI of an intensity of $4 \times 10^{-5}$T can be applied to the amorphous material 46, 48 which is spaced apart from the centerline of the conductor wire 42, 44 by a distance of 1000 μm($10^{-3}$ m). This intensity corresponds to the terrestrial magnetism, and is considered to be sufficient to permit the alignment of magnetization of the amorphous material 46, 48 in the terrestrial magnetism.

The magnetic-field measuring device 10 according to the present embodiment described above has: the magnetic materials in the form of the amorphous materials 46 and 48 formed of a solid or liquid having magnetic anisotropy, or a composite of the solid and the liquid; the conductor wires 42 and 44 disposed adjacent to the amorphous wires 46 and 48, so as to give a current-induced magnetic-field vector having a component perpendicular to a direction of easy magnetization of the magnetic materials; and the coils 50 and 52 to detect the magnetic field. The magnetic-field measuring device 10 is configured to intermittently apply an electric current to the conductor wires 42 and 44, detect the electromotive forces generated by the coils 50 and 52, and obtain the outputs of the coils 50 and 52 as an output signal of the magnetic-field measuring device 10. The amorphous materials 46 and 48 generate the magnetic field on the basis of the electric current applied to the conductor wires 42 and 44, and the generated magnetic field causes the coils 50 and 52 to generate the electromotive forces. In this respect, it is noted that the direction of the easy magnetization is a direction in which the magnetic moment is easily oriented in the amorphous materials 46 and 48. The magnetic field can be detected by measuring the electromotive forces of the coils 50 and 52, so that it is not necessary to positively apply the electric current to the amorphous materials 46 and 48. Since it is not necessary to apply the electric current to the amorphous materials 46 and 48, the electrical connection of the amorphous materials 46 and 48 is not necessary, so that the magnetic-field measuring device 10 does not suffer from influences of physical changes of the amorphous materials 46 and 48 due to a soldering or similar operation.

The present embodiment is further configured to employ the amorphous materials 46 and 48 as the magnetic materials, so that the direction of magnetization of the amorphous materials 46 and 48 easily changes due to the magnetic field to be measured, and the magnetic field generated by application of the electric current to the conductor wires 42 and 44, whereby the electromotive forces are easily generated by the coils 50 and 52 in the magnetic fields. Accordingly, the magnetic field can be easily measured with a high degree of accuracy.

The present embodiment is also configured such that the electric current to be applied to the conductor wires 42 and 44 is a pulse current, a current a value of which intermittently changes in a predetermined pattern, or a current which is a composite of those two currents superimposed on each other. Accordingly, the amount of the electric current applied to the conductor wires 42 and 44 intermittently changes, so that the magnetic field can be measured on the basis of changes of the electromotive forces of the coils 50 and 52 in synchronization of the change of the amount of the applied electric current.

The present embodiment is further configured such that the magnetic material consists of at least one amorphous wire 46, 48 having the direction of easy magnetization parallel to its longitudinal direction, and the electrically conductive body consists of at least one conductor wire 42, 44. Accordingly, the magnetic material and the electrically conductive body are suitably arranged in the present magnetic-field measuring device 10.

Other embodiments of this invention will be described. In the following description, the same reference signs are used to identify the same elements of the different embodiments, which will not be described redundantly.

Second Embodiment

Figure 5A:
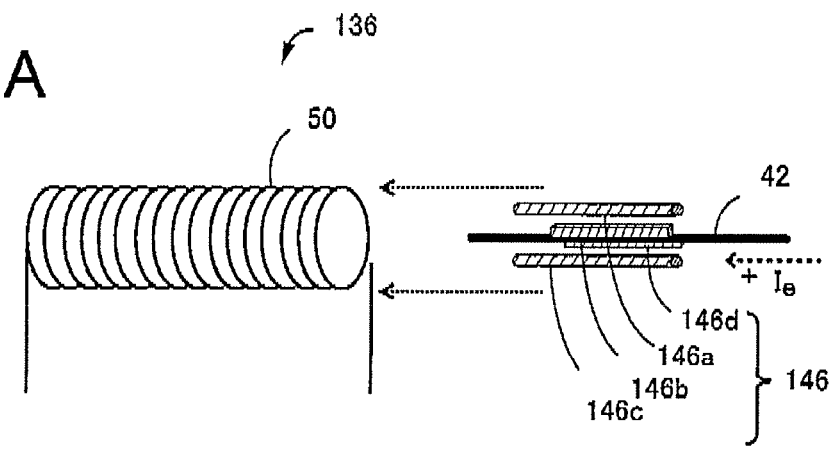
FIGS. 5A to 5B are views for schematically explaining a sensor used in a magnetic-field measuring device according to another embodiment of the invention.
Figure 5B:
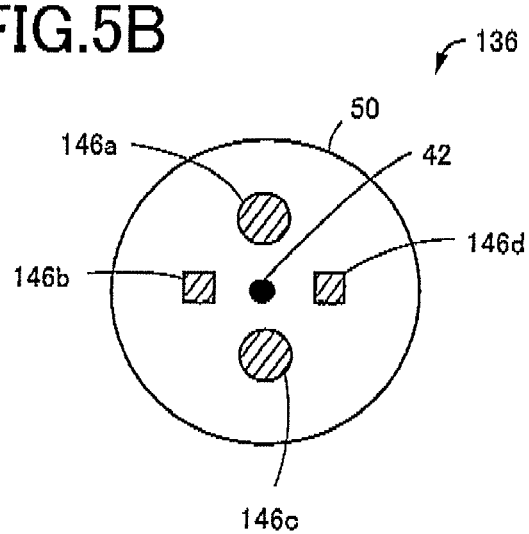

FIGS. 5A to 5B are the views for schematically explaining an arrangement of a sensor (iPA sensor) 136 used in the magnetic-field measuring device 10 according to another embodiment of the invention. FIG. 5A is the view for explaining an arrangement of the sensor 136, while FIG. 5B is a cross sectional view of the sensor 136 taken in a plane perpendicular to its longitudinal direction. This sensor 136 is used in place of the sensors 36 and 38 used in the preceding embodiment.

The sensor 136 shown in FIGS. 5A and 5B have substantially the same arrangement as the sensors 36, 38 in the first embodiment. Described more specifically, the sensor 136 has the magnetic material in the form of an amorphous material 146, the electrically conductive body in the form of the conductor wire 42, and the coil 50. The amorphous material 146 is an elongate amorphous wire. The conductor wire 42 is disposed adjacent to the amorphous material 146, and extends in the longitudinal direction of the amorphous material 146. The coil 50 is a solenoid coil defining an inner space through which the amorphous material 146 and the conductor wire 42 extend.

The amorphous material 146 used in the sensor 136 of FIGS. 5A and 5B consist of a plurality of (more precisely, four) amorphous material pieces 146a-146d. The present sensor 146 is different from the sensor 36, 38 in the first embodiment shown in FIG. 2, which uses a single piece of amorphous material 46, 48.

As shown in FIGS. 5A and 5B, the amorphous material consists of the plurality of amorphous wires, which may have different shapes. The number and the shapes of the amorphous wires may be selected according to the required detection sensitivity of the magnetic-field measuring device 10. Described more specifically, the amorphous material illustrated in FIGS. 5A and 5B consist of two amorphous material pieces 146a and 146c each having a circular cross sectional shape, and two amorphous material pieces 146b and 146d each having a square cross sectional shape. However, the amorphous material is not limited to this combination of the amorphous pieces. Namely, the amorphous material may include amorphous material pieces having a cross sectional shape other than the circular and square cross sectional shapes, and may consist of any number of amorphous material pieces having any combination of the cross sectional shapes, other than those of FIGS. 5A and 5B. That is, the present invention in which an electric current is not positively applied to the amorphous materials 46, 146a-146d has an advantage that changes of the number and the cross sectional surface areas of the amorphous material pieces do not cause a decrease of the amount of the exciting electric current, or an increase of a sum of the electric current amounts.

The sensor 136 according to the second embodiment has substantially the same advantages as described above with respect to the first embodiment. In addition, the sensor 136 has an additional advantage that the sensitivity of the sensor 136 can be selected depending upon the number and the cross sectional shapes of the pieces of the amorphous material 146.

Third Embodiment

Figure 6A:
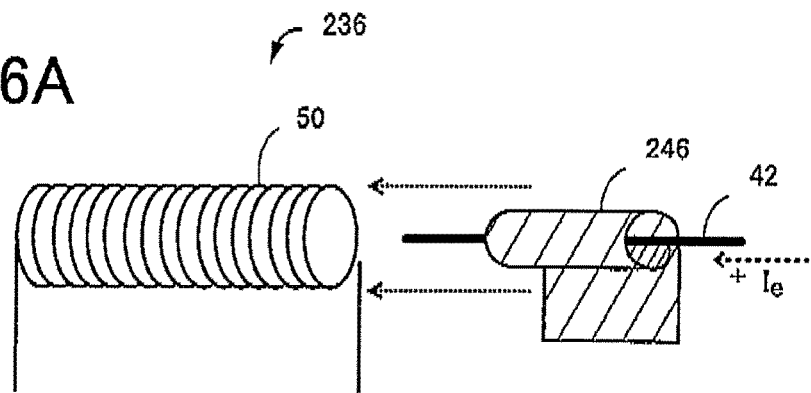
FIGS. 6A and 6B are views for schematically explaining a sensor used in a magnetic-field measuring device according to a further embodiment of the invention.
Figure 6B:
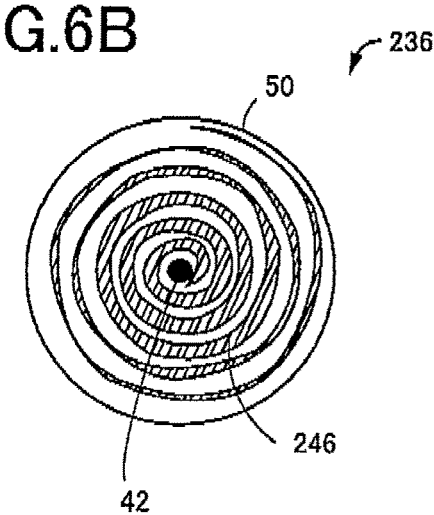

FIGS. 6A and 6B are the views for schematically explaining an arrangement of a sensor (iPA sensor) 236 used in the magnetic-field measuring device 10 according to a further embodiment of the invention. FIG. 6A is the view for explaining an arrangement of the sensor 236, while FIG. 6B is a cross sectional view of the sensor 236 taken in a plane perpendicular to its longitudinal direction. This sensor 236 is used in place of the sensors 36 and 38 used in the embodiment described above.

The sensor 236 shown in FIGS. 6A and 6B have substantially the same arrangement as the sensors 36, 38 in the first embodiment. Described more specifically, the sensor 236 has the magnetic material in the form of an amorphous material 246, the electrically conductive body in the form of the conductor wire 42, and the coil 50. The amorphous material 246 is a cylindrical amorphous material having magnetic anisotropy in the form of a spirally wound thin film. The conductor wire 42 extends through a central part of the spiral of the amorphous material 246. The thin film of the cylindrical amorphous material 246 may be spirally wound on the conductor wire 42. Preferably, the amorphous material 246 and the conductor wire 42 are electrically insulated from each other. However, a portion of the electric current may leak from the conductor wire 42 into the amorphous material 246, as long as a sufficient amount of the electric current flows through the conductor wire 42. That is, the amorphous material 246 and the conductor wire 42 need not be electrically insulated from each other.

It is noted that the amorphous material 246 may consist of at least one single film, namely, may consist of a plurality of films, the number of which is selected according to the required detection sensitivity of the magnetic-field measuring device 10.

In the present embodiment, too, the conductor wire 42 is disposed adjacent to the amorphous material 246, and extends in the longitudinal direction of the amorphous material 246. The coil 50 is a solenoid coil defining an inner space through which the amorphous material 246 and the conductor wire 42 extend.

In the magnetic-field measuring device 10 using the sensor 236 according to the third embodiment, the magnetic material is the amorphous material 246 in the form of at least one cylindrical film or layer, which has magnetic anisotropy and which is wound on the conductor wire 42 so as to surround the conductor wire 42. Accordingly, the magnetic-field measuring device 10 has substantially the same advantage, and can be configured such that the amorphous material 246 and the conductor wire 42 are disposed adjacent to each other.

Fourth Embodiment

Figure 7A:
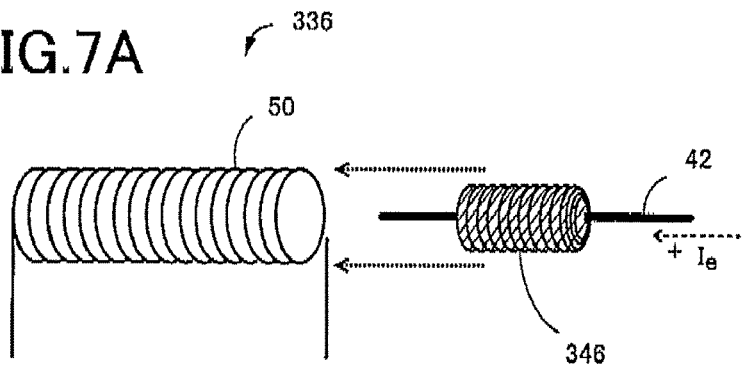
FIGS. 7A to 7B are views for schematically explaining a sensor used in a magnetic-field measuring device according to a still further embodiment of the invention.
Figure 7B:
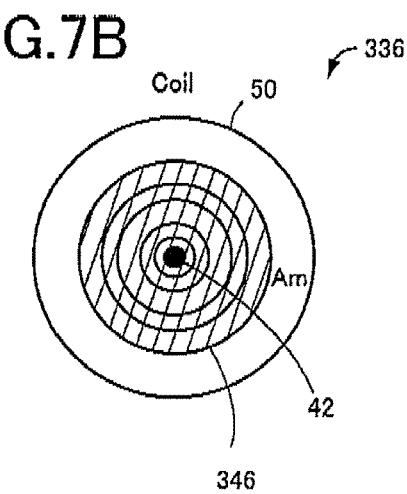

FIGS. 7A and 7B are the views for schematically explaining an arrangement of a sensor (iPA sensor) 336 used in the magnetic-field measuring device 10 according to a still further embodiment of the invention. FIG. 7A is the view for explaining an arrangement of the sensor 336, while FIG. 7B is a cross sectional view of the sensor 336 taken in a plane perpendicular to its longitudinal direction. This sensor 336 is used in place of the sensors 36 and 38 used in the embodiment described above.

The sensor 336 shown in FIGS. 7A and 7B have substantially the same arrangement as the sensors 36, 38 in the first embodiment. Described more specifically, the sensor 336 has the magnetic material in the form of an amorphous material 346, the electrically conductive body in the form of the conductor wire 42, and the coil 50. The amorphous material 346 is an elongate amorphous material having magnetic anisotropy in the form of a wire or a wide strip, for example, which is wound in a coil surrounding the conductor wire 42. The wire or strip of the amorphous material 346 may be directly wound on the conductor wire 42, or initially wound so as to define a central cylindrical space, and the conductor wire 42 is then passed through the central cylindrical space. The amorphous material 346 and the conductor wire 42 surrounded by the amorphous material 346 may be electrically insulated from each other, as in the preceding third embodiment, or may not be insulated from each other.

The winding pitch and the number of wound layers of the amorphous material 346 are selected according to the required detection sensitivity of the magnetic-field measuring device 10. Described more specifically, the wire or strip may be wound such that adjacent turns of the wire or strip are not spaced apart from each other, or spaced apart from each other by a predetermined spacing distance. While the wire or strip is required to be wound in at least one layer, it may be wound in a plurality of layers.

In the present embodiment, the conductor wire 42 is disposed adjacent to the amorphous material 346, but the longitudinal direction of the conductor wire 42 is not parallel to the direction of length of the wire or strip of the amorphous material 346. This embodiment also enjoys the advantages of the present invention to some extent. The coil 50 is a solenoid coil defining an inner space through which the amorphous material 346 and the conductor wire 42 extend.

In the magnetic-field measuring device 10 using the sensor 336 according to the fourth embodiment, the magnetic material is the elongate amorphous material 346 having magnetic anisotropy, and the amorphous material 346 consists of at least one layer wound on the conductor wire 42 so as to surround the conductor wire 42. Accordingly, the magnetic-field measuring device 10 has substantially the same advantages as described above with respect to the first through third embodiments, and can be configured such that the amorphous material 346 and the conductor wire 42 are disposed adjacent to each other.

Fifth Embodiment

Figure 8:
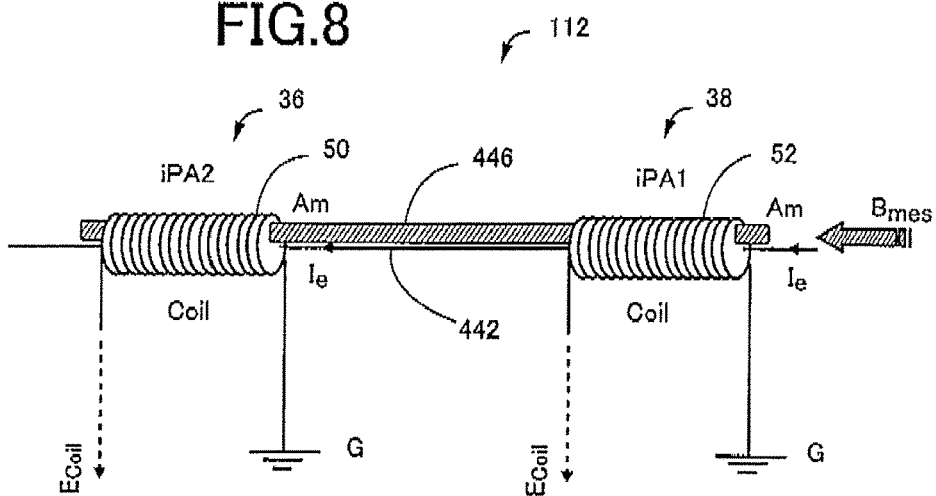
FIG. 8 is a view corresponding to that of FIG. 3, for explaining an arrangement of a probe portion provided in a yet further embodiment of the invention.

FIG. 8 is the view corresponding to that of FIG. 3, for explaining an arrangement of a probe portion 112 provided in a yet further embodiment of the invention. Namely, the probe portion 112 according to the present embodiment is used in place of the probe portion 12 of FIG. 3. In the probe portion 12 of FIG. 3, the two sensors 36 and 38 have the respective amorphous materials 46 and 48 and the respective conductor wires 42 and 44. However, the probe portion 112 of FIG. 8 is different from the probe portion 12 of FIG. 3 in that the two sensors 36 and 38 in the probe portion 112 of FIG. 8 have a common amorphous material 446 and a single conductor wire 442. The common amorphous material 446 is commonly used for the two sensors 36 and 38, so as to magnetically connect these two sensors 36 and 38 in series with each other.

As shown in FIG. 8, the amorphous material 446 has a symmetrical shape with respect to a straight line of symmetry which passes a midpoint in its direction of easy magnetization, that is, in its longitudinal direction, and which is perpendicular to the direction of easy magnetization. The two coils 50 and 52 of the respective sensors 36 and 38 are disposed at respective positions which are symmetrical with each other with respect to the line or plane of symmetry. According to the finding of the present inventors, this arrangement permits symmetry of a magnetic field such as the ambient magnetic field commonly applied to the two sensors 36 and 38, with respect to the longitudinal midpoint or the line of symmetry of the amorphous material 446. Accordingly, where the two sensors 36 and 38 function as a gradiometer, an influence of the ambient magnetic field can be effectively eliminated, so that the two sensors 36 and 38 can improve the accuracy of measurement of the magnetic-field measuring device 10. This improvement is also described in Patent Document 5.

The present embodiment is configured such that the amorphous material 446 has a symmetrical shape with respect to a straight line of symmetry which passes a midpoint in its direction of easy magnetization, and which is perpendicular to the direction of easy magnetization, and the two coils 50 and 52 of the sensors 36 and 38 are disposed at respective positions which are symmetrical with each other with respect to the line of symmetry, whereby the two sensors 36 and 38 function as a gradiometer. Accordingly, a differential operation performed by the two sensors 36 and 38 permits effective elimination of an influence of the ambient magnetic field such as the terrestrial magnetic field, so that the accuracy of measurement of the magnetic-field measuring device 10 provided with the gradiometer can be improved.

Sixth Embodiment

Figure 9:
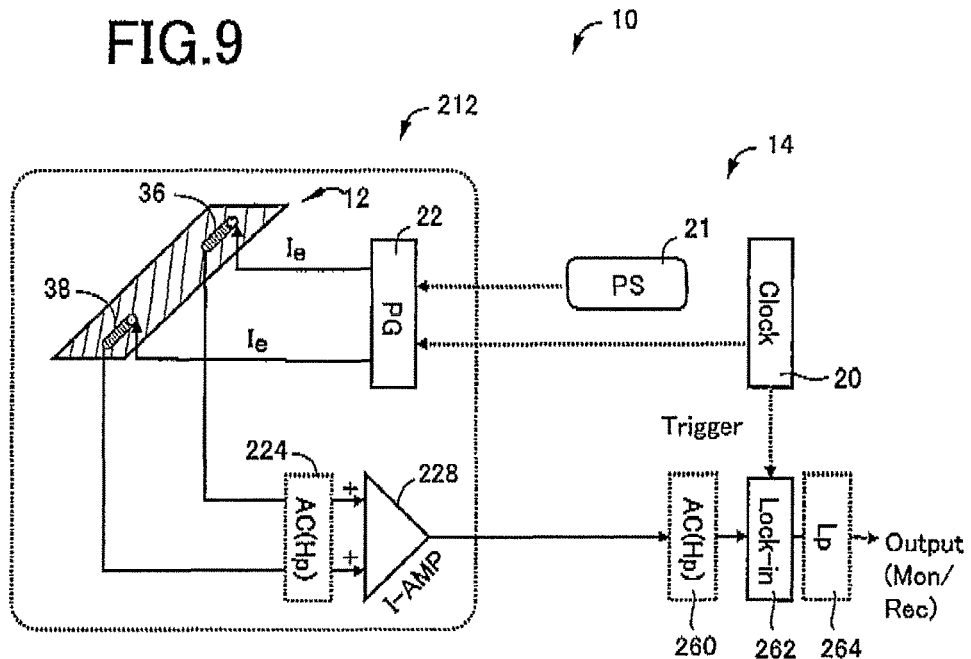
FIG. 9 is a view corresponding to that of FIG. 1, for explaining an arrangement of a magnetic-field measuring device according to still another embodiment of the invention.

FIG. 9 is the view for explaining an arrangement of the magnetic-field measuring device 10 according to still another embodiment of the invention. In the magnetic-field measuring device 10 of FIG. 9, a part of the device 10 including the probe portion 12 functions as a sensor probe 212. This sensor probe 212 is structurally separated from a main body of the magnetic-field measuring device 10, and the sensor probe 212 and the main body are electrically connected to each other with a cable, so that a magnetic field at a position distant from the main body can be measured. In the embodiment of FIG. 9, the sensor probe 212 includes the pulse generator 22, an AC coupler 224 and an instrumentation amplifier 228, in addition to the probe portion 12. The pulse generator 22 is a part of the circuit portion 14. However, the sensor probe 212 is not limited to this arrangement. A part of this sensor probe 212 may be eliminated, or conversely, other parts of the circuit portion 14 may be included in the sensor probe 212.

The circuit portion 14 in the present embodiment includes the clock portion 20, the power supply portion 21, the pulse generator 22, the AC coupler 224, the instrumentation amplifier 228, an AC coupler 260, a lock-in amplifier 262, and a low-pass filter 264. The clock portion 20, power supply portion 21 and pulse generator 22 are identical with those in the first embodiment described above, and will not be described redundantly. Preferably, the clock signal generated by the clock portion 20 is a clock signal having a high degree of accuracy, for example, not lower than a five-digit value. The clock portion 20 need not be included in the circuit portion 14, and may be disposed outside the magnetic-field measuring device 10, for example, so that the clock signal is sent from the clock portion 20 to the magnetic-field measuring device 10.

The outputs of the sensors 36 and 38 are applied to the instrumental amplifier through the AC coupler 224. In this respect, the outputs of the sensors 36 and 38 may be applied to the AC coupler 224 through a band-pass filter which permits passage of only a frequency band from 10 kHz to 100 MHz, for instance, in order to remove noises from the outputs. The outputs of the sensors 36 and 38 are coupled by the AC coupler 224, and a difference between the outputs is obtained by the instrumentation amplifier 228. Further, the difference is amplified by the instrumentation amplifier 228 by a predetermined ratio of amplification.

The output of the instrumentation amplifier 228 is applied to and coupled by the AC coupler 260. A high-pass filter is provided, as needed to remove a low frequency component of the output of the AC coupler 260 corresponding to the frequency of the clock signal. The output of the AC coupler 260 is then applied to the lock-in amplifier 262, which detects an amplitude of a difference between the electromotive forces of the sensors 36 and 38, on the basis of the clock signal generated from the clock portion 20. The thus detected amplitude is processed into a continuous value, which is then offset by an amount corresponding to a predetermined offset voltage, and amplified by a predetermined ratio of amplification, for example, by 1000 times. The output of the lock-in amplifier 262 is applied to the low-pass filter 264, so that a frequency component lower than a predetermined frequency value is removed from the output, whereby an output of the low-pass filter 264 is obtained. This output may represent the offset voltage and a phase of detection (delay time), in addition to the amplified signal value.

The magnetic-field measuring device 10 according to the present embodiment has substantially the same advantages as that of the first embodiment. In addition, the sensor probe 212 is structurally separated from the main body of the magnetic-field measuring device 10, so that the magnetic field at a position distant from the main body can be measured.

Seventh Embodiment

Figure 10:
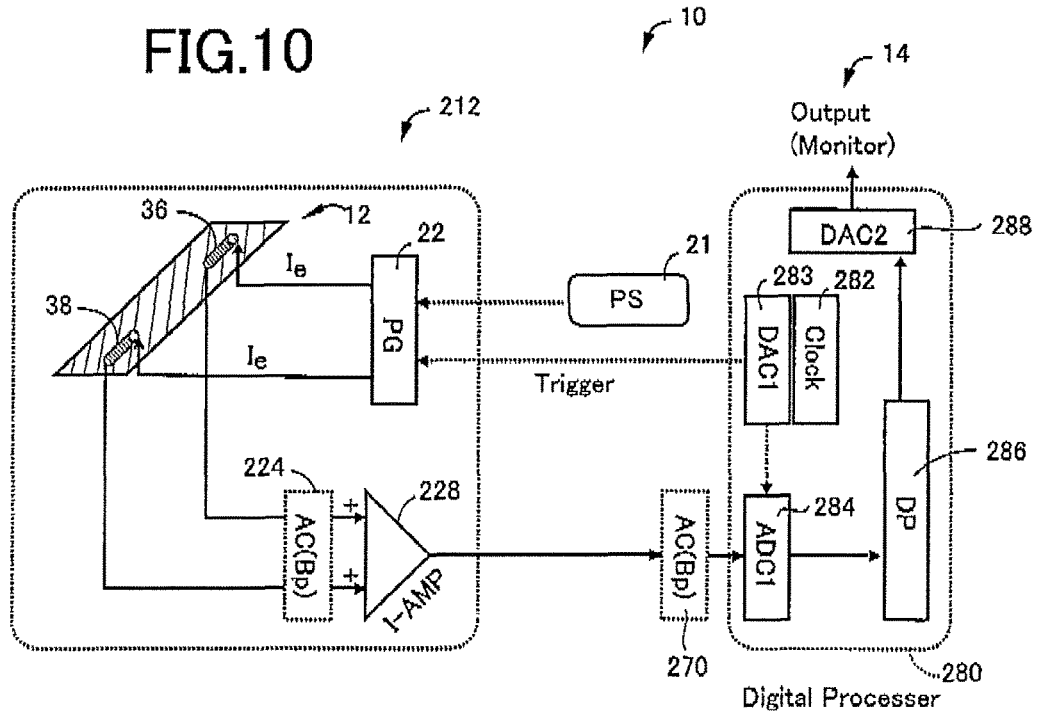
FIG. 10 is a view corresponding to that of FIG. 9, for explaining an arrangement of a magnetic-field measuring device according to yet another embodiment of the invention.

FIG. 10 is the view corresponding to that of FIG. 9, for explaining an arrangement of the magnetic-field measuring device 10 according to yet another embodiment of the invention. As shown in FIG. 10, the circuit portion 14 in the present embodiment is different from the circuit portion 14 in the preceding embodiments, in that the present circuit portion 14 is provided with a digital processing portion 280. This digital processing portion 280 has a function of implementing AD conversion of signals.

The operations of the power supply portion 21 and the pulse generator 22 are the same as those in the preceding embodiments, and will not be described redundantly. In the preceding embodiments, the clock portion 20 is provided in the circuit portion 14 as shown in FIG. 9. In the present embodiment, a clock portion 282 is provided within the digital processing portion 280, as shown in FIG. 10. Described more specifically, a clock signal in the form of a digital signal generated by the clock portion 282 provided within the digital processing portion 280 is converted by a first DA converting portion 283 into an analog signal, which is applied to the pulse generator 22. In this respect, the clock signal may be applied to the pulse generator 22 from a clock portion located outside the magnetic-field measuring device 10, as the sixth embodiment.

The operations of the AC coupler 224 and the instrumentation amplifier 228 provided to process the outputs of the sensors 36 and 38 are also the same as those in the preceding embodiments, and will not be described redundantly. The output of the instrumentation amplifier 228 is applied to an AC coupling portion 270, for a coupling operation. A band-pass filter is provided, as needed to pass only components within a predetermined frequency band of the output of the AC coupling portion 270 corresponding to the frequency of the clock signal.

The output of the AC coupling portion 270 is applied to the digital processing portion 280 wherein a first AD converting portion 284 implements a high-speed AD converting operation to convert the output of the AC coupling portion 270 into a digital signal. This first AD converting portion 284 receives the clock signal from the clock portion 282 through the above-described first DA converting portion 283, so that the first AD converting portion 284 operates in synchronization with the clock signal. The digital signal generated by the first AD converting portion 284 is processed by a data processing portion 286 described below, and may be stored in a memory device (not shown) provided within the digital processing portion 280, or sent to any other device.

In the data processing portion 286, successive values of the difference between the digital signals obtained by conversion from the output signals of the sensors 36 and 38 are summed to reduce the noise level. Then, the amplitude of the difference at a predetermined phase (at a predetermined point of time delay) is detected. This amplitude corresponds to the magnetic field to be measured. The data obtained by the processing operation of the data processing portion 286 are converted by a second DA converting portion 288 into an analog signal, and displayed on a monitor (not shown), for example.

Figure 11:
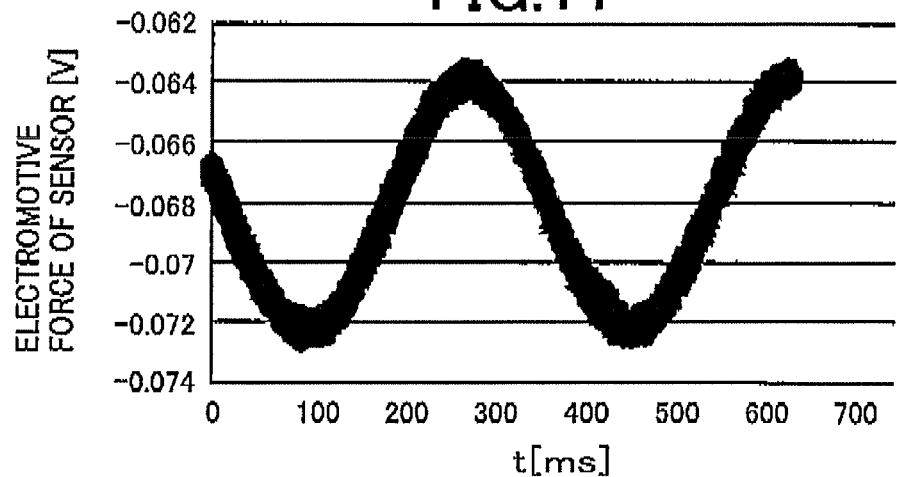
FIG. 11 is a view indicating a result of an experiment of magnetic-field measurement by the magnetic-field measuring device according to the first embodiment.
Figure 12:
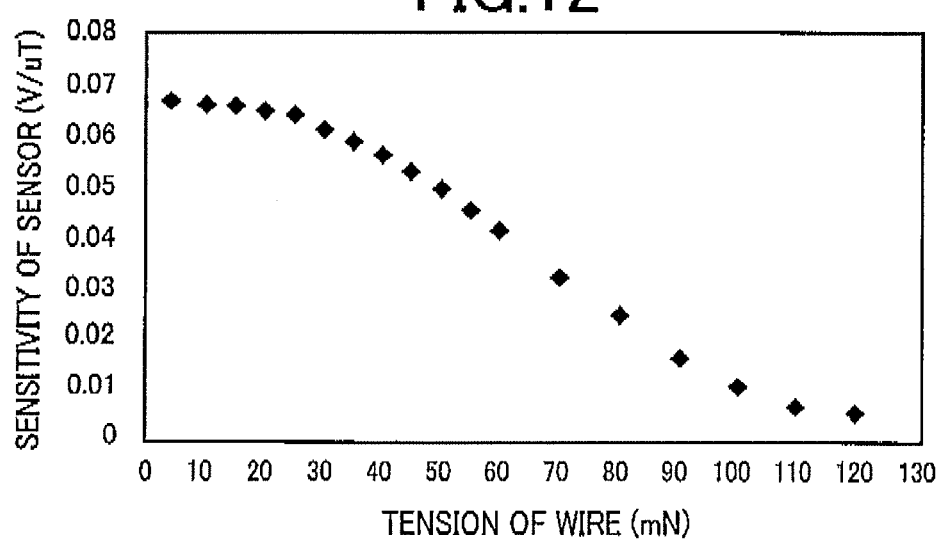
FIG. 12 is a view indicating a relationship between a tension of amorphous wires and a sensitivity of an MI sensor provided with the amorphous wires.

FIG. 11 is the view indicating a result of an experiment of magnetic-field measurement by the magnetic-field measuring device 10 according to the illustrated embodiments. In the experiment, the magnetic-field measuring device shown in FIG. 1 uses the sensors 36 and 38 shown in FIG. 8. The exciting electric current Ie applied from the pulse generator 22 to the conductor wires 42 and 44 of the sensors 36 and 38 is a pulse current of 100 mA having a pulse width of 100 ns and an amplitude of 5V. In the sensors 36 and 38, the conductor wires 42 and 44 are spaced apart from the respective amorphous materials 46 and 48, by a distance of 300 μm. As the magnetic field to be measured, a three-dimensional Helmholtz coil of about two square meters is disposed to apply a weak magnetic field the intensity of which varies in a sine wave, to the sensors 36 and 38 and their vicinities. FIG. 11 indicates a chronological variation of the output of one of the sensors 36 and 38 (the output of the sensor 36, for example) of the magnetic-field measuring device 10. Thus, the magnetic-field measuring device provides the output in the sine wave similar to that of the applied magnetic field. In the present experiment in which the amplification by the differential amplifier 228 is not implemented, the value taken along the vertical line of FIG. 11 represents the output voltage of the sensor (sensor 36, for example).

The magnetic-field measuring device 10 according to the present embodiment has substantially the same advantages as the magnetic-field measuring device 10 according to the sixth embodiment described above. In addition, the present magnetic-field measuring device 10 provided with the digital processing portion 280 permits digital processing and storage of data, and an output of digital data.

It is to be understood that the present invention may be embodied with various changes not illustrated, herein, which may occur without departing from the spirit and scope of the invention.

For example, the magnetic-field measuring device of the invention is not limited to the magnetic-field measuring device 10 according to the illustrated embodiments wherein the two sensors 36 and 38 are used to provide a gradiometer, and may be modified to implement a magnetic-field measurement by using only one sensor. In this modification, it is not necessary to provide the differential amplifier 28 and the other parts of the circuit portion 14 required to process the outputs of the two sensors.

In the illustrated embodiments, the electric current applied from the pulse generator 22 to the conductive portions 42 and 44 of the probe portion 12 takes the form of a rectangular wave. However, the form of the electric current is not limited to the rectangular wave, and may be a sine wave, a sawtooth wave, a triangular wave or an alternating wave, as long as the value of the electric current intermittently changes in a predetermined pattern. Further, a direct current component which is offset by a predetermined value in the positive or negative direction with respect to the predetermined pattern may be superimposed on the predetermined pattern. The period at which the value of the electric current intermittently changes need not be held constant, and the rectangular wave of the electric current, for example, is not limited to the one in which a high-output time period and a low-output time period are equal to each other.

The illustrated embodiments use the amorphous materials 46, 48, 146, 246, 346 and 446 in the form of a wire or sheet, as the magnetic materials. However, the magnetic materials are not limited to those amorphous materials, as long as the magnetic materials have magnetic anisotropy. Described more specifically, the magnetic materials may be a liquid having magnetic anisotropy, such as an ion liquid containing particles having magnetic anisotropy, which liquid is accommodated in a suitable container. Further, the magnetic materials may be a composite of the amorphous materials and the above-indicated ion liquid.

In the illustrated embodiments, the sample hold circuits 24 and 26 in the circuit portion 14 are configured to detect the peaks (peak values) of the amplitude of the electromotive forces Ecoil1 and Ecoil2 of the respective coils 50 and 52. However, the electromotive forces Ecoil1 and Ecoil2 of the coils 50 and 52 may be initially applied to respective band-pass filters (not shown), for AC coupling operations, so that the outputs of the band-pass filters are applied to the respective sample hold circuits 24 and 26.

While the conductor wires 42 and 44 and the amorphous materials 46 and 48 are electrically insulated from each other in the illustrated embodiments, this electric insulation is not essential. Namely, the conductor wires 42 and 44 may be held in contact with the amorphous materials 46 and 48 such that a very small component of the electric current flowing through each of the conductor wires 42 and 44 leaks into the corresponding amorphous material 46, 48.

In the illustrated embodiments, the conductor wires 42 and 44 and the amorphous materials 46 and 48 extend through the inner spaces of the respective solenoid coils 50 and 52. However, this arrangement is not essential. Namely, the amorphous materials 46 and 48 and/or the conductor wires 42 and 44 may be disposed outside the solenoid coils 50 and 52, as long as the electromotive forces are generated on the basis of variations of magnetization of the amorphous materials 46 and 48.

In the illustrated third embodiment, the cylindrical amorphous material 246 is in the form of a spirally wound sheet. However, the cylindrical amorphous material 246 is not limited to this form. Described more specifically, the cylindrical amorphous material 246 may be formed during its manufacture, by drawing a piece of the original material into a cylindrical or tubular shape.

In the illustrated fifth embodiment, the amorphous material 446 commonly used for the two sensors 86 and 38 may be a one-piece body, or at least two pieces of the magnetic material magnetically connected to each other. In the latter case, the at least two pieces need not be held in close contact with each other, and may be spaced apart from each other, as long as the at least two pieces are substantially magnetically connected in series with each other.

In the illustrated fifth embodiment, the amorphous material 446 has a symmetrical shape with respect to a straight line of symmetry which is perpendicular to the direction of easy magnetization. However, the amorphous material 446 need not have this symmetrical shape. For instance, the amorphous material 446 may have a symmetrical shape with respect to a straight plane of symmetry perpendicular to the direction, of easy magnetization. That is, the distribution of magnetization of the amorphous material 446 is required to be symmetrical with respect to the midpoint in the direction of easy magnetization.

In the illustrated fifth embodiment, the amorphous material 446 is a single amorphous wire. However, the amorphous material 446 need not be the single amorphous wire. For example, the single amorphous material (wire) 446 may be replaced by a plurality of wires, as in the illustrated second through fourth embodiments. The single amorphous wire or each of the amorphous wires may have a cross sectional shape other than a circular shape. Further, the elongate amorphous material 446 may be replaced by a cylindrical amorphous material in the form of a wound sheet, or an elongate amorphous material wound in the form of a solenoid extending through the coils 50 and 52.

In the illustrated sixth embodiment, the sensor probe 212 is structurally separated from the main body of the magnetic-field measuring device 10, and the circuit portion 14 has a circuit different from that in the first embodiment. However, this arrangement is not essential. The circuit portion 14 may have the same arrangement as that of FIG. 1, while the sensor probe 212 is structurally separated from the main body of the magnetic-field measuring device 10. Conversely, the circuit portion 14 used in the sixth or seventh embodiment may be used in the first embodiment.

In the illustrated seventh embodiment, a difference between the analog output signals of the two sensors 36 and 38 is calculated and amplified by the instrumentation amplifier 228, and the difference is subsequently converted by the first AD converting portion 284 into a digital signal, which is processed by the data processing portion 286. However, this arrangement is not essential. For instance, the output signals of the sensors 36 and 38 may be amplified by respective amplifiers, and the amplified signals are converted by respective AD converting portions into digital signals, which are applied to the data processing portion 286 so that a difference between the digital signals is calculated by the data processing portion 286.

In the illustrated seventh embodiment, the data processing portion 286 may be modified to implement the Fourier transform of chronologically accumulated data, in addition to the processing operation described above. In this case, more accurate calculation can be made on, the basis of an amplitude and a surface area of the desired peaks in the frequency domain, and signal variations in the time domain apparently caused by factors other than the variation of the magnetic field can be estimated.

Where at least a portion of the electromotive forces of the coils during and after application of the exciting electric current is calculated by high-speed AD conversion by the first AD converting portion 284 in the illustrated seventh embodiment, the induced electromotive forces of the sensors 36 and 38 can be effectively detected by providing the circuit portion 14 with a band-pass filter to adjust the frequency band to be passed, so that the circuit portion 14 is used as an adequate resonance circuit. Namely, not only the peak values of the electromotive forces directly induced during application of the exciting electric current, but also the resonance waveforms during a time period after the application of the exciting electric current can be detected. Accordingly, the sensitivity of detection of the magnetic-field measuring device 10 can be improved by implementing the Fourier transform of the detected resonance waveforms, and adjusting the signal intensity in the desired frequency band in the frequency domain including the resonance waveforms.

The AC couplers 224 and 260 used in the illustrated embodiments may be replaced by DC couplers. This modification has substantially the same advantages as described above.

NOMENCLATURE OF REFERENCE SIGNS

10: Magnetic-field measuring device
36, 38, 136, 236, 336: Sensors
42, 44, 442: Conductor wires (Electrically conductive bodies)
46, 48, 146, 246, 346, 446: Amorphous materials (Magnetic materials)
50, 52: Coils

The invention claimed is:

1. A magnetic-field measuring device having: an elongate magnetic material formed of a solid or liquid having magnetic anisotropy, or a composite of said solid and liquid; an electrically conductive body disposed adjacent to said magnetic material, so as to give said magnetic material a current-induced magnetic-field vector having a component in a direction perpendicular to a longitudinal direction of said magnetic material; and a coil to detect a magnetic field generated by said magnetic material, wherein said magnetic material is magnetized in a direction perpendicular to its longitudinal direction when an external magnetic field is not applied to said magnetic material or when only a magnetic field not having a component in its longitudinal direction is applied to said magnetic material, and is magnetized in a direction having the component in said longitudinal direction when the external magnetic field having the component in the longitudinal direction of said magnetic material is applied to said magnetic material, and a direction of magnetization of said magnetic material is aligned with a specific direction perpendicular to the longitudinal direction of said magnetic material when the magnetic material is sufficiently given said current-induced magnetic-field vector, said magnetic-field measuring device being
configured to intermittently apply an electric current to said electrically conductive body, and detecting an electromotive force generated by said coil while the electric current is applied to said electrically conductive body and while the electric current is not applied to the electrically conductive body.

2. The magnetic-field measuring device according to claim 1, wherein said magnetic material is an amorphous material.

3. The magnetic-field measuring device according to claim 1, wherein said electric current is a pulse current, a current a value of which intermittently changes in a predetermined pattern, or a current which is a composite of those two currents superimposed on each other.

4. The magnetic-field measuring device according to claim 1, wherein said magnetic material consists of at least one amorphous wire, and said electrically conductive body consists of at least one conductor wire.

5. The magnetic-field measuring device according to claim 1, wherein said magnetic material has a symmetrical shape with respect to a straight line or plane of symmetry which passes a midpoint in the longitudinal direction of said magnetic material, and which is perpendicular to said longitudinal direction, and said coil consists of two coils which are disposed at respective positions which are symmetrical with each other with respect to said line or plane of symmetry, whereby the magnetic-field measuring device is provided with a gradiometer.

6. The magnetic-field measuring device according to claim 1, wherein said magnetic material includes an amorphous material having magnetic anisotropy, and said amorphous material consists of at least one cylindrical layer surrounding said electrically conductive body.

\* \* \* \* \*